(12) United States Patent
Savelli et al.

(10) Patent No.: US 11,444,232 B2
(45) Date of Patent: Sep. 13, 2022

(54) METHOD FOR MANUFACTURING A THERMOELECTRIC DEVICE BY ADDITIVE MANUFACTURING OF COMBS TO BE SET IN CONTACT WITH ONE ANOTHER

(71) Applicant: COMMISSARIAT A L'ENERGIE ATOMIQUE ET AUX ENERGIES ALTERNATIVES, Paris (FR)

(72) Inventors: Guillaume Savelli, Grenoble (FR); Christelle Navone, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/489,491

(22) Filed: Sep. 29, 2021

(65) Prior Publication Data
US 2022/0102610 A1 Mar. 31, 2022

(30) Foreign Application Priority Data
Sep. 29, 2020 (FR) ...................................... 20/09910

(51) Int. Cl.
| | | |
|---|---|---|
| H01L 35/34 | (2006.01) | |
| H01L 35/14 | (2006.01) | |
| H01L 35/32 | (2006.01) | |
| B33Y 10/00 | (2015.01) | |

(52) U.S. Cl.
CPC .............. *H01L 35/34* (2013.01); *H01L 35/14* (2013.01); *H01L 35/32* (2013.01); *B33Y 10/00* (2014.12)

(58) Field of Classification Search
CPC .......... H01L 35/34; H01L 35/32; H01L 35/14
See application file for complete search history.

(56) References Cited

U.S. PATENT DOCUMENTS 6,232,542 B1 * 5/2001 Hiraishi .................. H01L 35/32
136/201
6,310,383 B1 * 10/2001 Watanabe ............... H01L 35/32
257/470

(Continued)

FOREIGN PATENT DOCUMENTS

| EP | 0 930 658 A1 | 7/1999 | |
| EP | 0930658 A1 * | 7/1999 | ............. B33Y 10/00 |

(Continued)

*Primary Examiner* — Golam Mowla
(74) *Attorney, Agent, or Firm* — Oliff PLC

(57) ABSTRACT

A method for manufacturing a thermoelectric device where a first part formed in a first doped material and a second part formed in a second doped material each shaped like a comb are manufactured, before being assembled together and electrically connected. Then, the first base of the first part is sectioned into at least one first area and the second base of the second part is sectioned into at least one second area. Each first branch of the first part and each second branch of the second part separated respectively constitute a first element and a second element of a thermoelectric junction, electrically connected via portion of the second base that links them. In addition, each first branch and each second branch separated by a second area constitute a first element and a second element of a thermoelectric junction, electrically connected via the portion of the first base.

11 Claims, 3 Drawing Sheets

(56) References Cited

U.S. PATENT DOCUMENTS

| | | | |
|---|---|---|---|
| 6,441,295 B2* | 8/2002 | Hiraishi | H01L 35/32 136/201 |
| 6,441,296 B2* | 8/2002 | Hiraishi | H01L 35/34 136/201 |
| 6,700,053 B2* | 3/2004 | Hara | H01L 23/38 136/203 |
| 7,884,277 B2* | 2/2011 | Perlo | H01L 35/30 136/201 |
| 9,882,111 B2* | 1/2018 | Cauchon | H01L 35/32 |
| 10,224,474 B2* | 3/2019 | Cornett | H01L 35/34 |
| 10,566,514 B2* | 2/2020 | Ha | H01L 35/34 |
| 10,991,870 B2* | 4/2021 | Anosov | H01L 35/32 |
| 2001/0001960 A1* | 5/2001 | Hiraishi | H01L 35/32 136/201 |
| 2001/0001961 A1* | 5/2001 | Hiraishi | H01L 35/34 136/201 |
| 2005/0139249 A1* | 6/2005 | Ueki | H01L 35/32 136/211 |
| 2006/0102223 A1* | 5/2006 | Chen | H01L 35/32 257/E27.008 |
| 2008/0245397 A1* | 10/2008 | Moczygemba | H01L 35/34 438/666 |
| 2009/0090409 A1* | 4/2009 | Moczygemba | H01L 35/32 136/201 |
| 2011/0146741 A1* | 6/2011 | Hida | H01L 35/08 136/201 |
| 2013/0255740 A1* | 10/2013 | Delaizir | H01L 35/32 438/54 |
| 2014/0130838 A1* | 5/2014 | Hida | H01L 35/34 438/54 |
| 2017/0069817 A1* | 3/2017 | Cauchon | H01L 35/32 |
| 2019/0131508 A1* | 5/2019 | Kasztelan | H01L 35/16 |
| 2021/0399189 A1* | 12/2021 | Cha | H01L 35/04 |

FOREIGN PATENT DOCUMENTS

| | | | | |
|---|---|---|---|---|
| JP | H11-8416 A | | 1/1999 | |
| JP | H11135841 A | * | 5/1999 | H01L 35/32 |
| JP | 2000022224 A | * | 1/2000 | H01L 35/32 |
| JP | 2001135866 A | * | 5/2001 | H01L 35/32 |
| JP | 2001358373 A | * | 12/2001 | B33Y 10/00 |
| JP | 2020053572 A | * | 4/2020 | B33Y 10/00 |

* cited by examiner

METHOD FOR MANUFACTURING A THERMOELECTRIC DEVICE BY ADDITIVE MANUFACTURING OF COMBS TO BE SET IN CONTACT WITH ONE ANOTHER

TECHNICAL FIELD OF THE INVENTION

The present invention concerns a method for manufacturing a thermoelectric device, which thermoelectric device comprises a plurality of thermoelectric junctions where each thermoelectric junction, on the one hand, is arranged between a first thermal side and a second thermal side of the thermoelectric device and, on the other hand, comprises a first element doped according to a first doping type extending between said first and second thermal sides and a second element doped according to a second doping type and extending between said first and second thermal sides, the first element and the second element being electrically connected together at one of said first and second thermal sides and allowing generating a thermoelectric effect.

The invention allows manufacturing a thermoelectric device where each thermoelectric junction of the thermoelectric device is configured to generate a thermoelectric effect, in particular during the operation of the thermoelectric device. In the Seebeck mode, the thermoelectric effect is such that the at least one thermoelectric junction enables the generation of an electrical energy when it is subjected to a temperature difference applied to the thermoelectric device between its first thermal side and its second thermal side. In the Peltier mode, the thermoelectric effect is such that the at least one thermoelectric junction enables the generation of a thermal energy (temperature difference between the first and second thermal sides) when it is subjected to an electrical energy electrically powering said at least one thermoelectric junction.

STATE OF THE ART

In a known manner, and as illustrated in FIG. 1, a thermoelectric device 100 may include a set of first pads 101 made of a thermoelectric material and a set of second pads 102 made of a thermoelectric material different from the thermoelectric material of the first pads 101. The first and second pads 101, 102 are electrically connected so as to form thermoelectric junctions 103 between a first side 104, for example called hot side, of the thermoelectric device 100 and a second side 105, for example called cold side, of the thermoelectric device 100. Each thermoelectric junction 103 includes one of the first pads 101 and one of the second pads 102. For each thermoelectric junction 103, an electrical linking element 106 allows electrically connecting the first pad 101 and the second pad 102 of the corresponding thermoelectric junction 103, also called NP junction in the field. Connecting elements 107 allow electrically connecting the thermoelectric junctions 103 together in series and/or in parallel. The thermoelectric device 100 of FIG. 1 is composed by several first and second pads 101, 102 electrically connected in series and thermally connected in parallel so as to form four thermoelectric junctions 103. In particular, in the field, the first and second pads 101, 102 are also called N pads and P pads, respectively, a N pad being a pad with N-type conductivity (that is to say the material composing it has a strictly negative Seebeck coefficient) and a P pad being a pad with P-type conductivity (that is to say the material composing it has a strictly positive Seebeck coefficient).

In general, considering that the dimensions (in particular the height and the section) of the first and second pads are identical, the electrical performances of the thermoelectric device 100 used as an energy generator, in particular electrical energy generator, could be determined in a simplified manner by:
- an internal electrical resistance, denoted Rint, determined for example in the following manner (denoted equation (1) later on):

$$Rint = N \times pnp \times H/A$$

with N the number of thermoelectric junctions of the thermoelectric device, H the height of one of the first pads 101 of one of the thermoelectric junctions of the thermoelectric device 100, this height H being measured according to an axis orthogonal to the first side 104 and to the second side 105, A the surface area of the section of said first pad 101 considered orthogonally to the direction in which H is measured, and pnp corresponding to the electrical resistivity of said first pad 101 (this electrical resistivity being considered to be identical for each first pad 101 and each second pad 102);
- an output voltage, denoted V, which could be determined in the following manner (denoted equation (2) later on):

$$V = N \times Snp \times \Delta T$$

with Snp the Seebeck coefficient associated to one of the thermoelectric junctions of the thermoelectric device, Snp being the difference between Sp and Sn, $\Delta T$ the effective temperature difference between the first side 104 and the second side 105 to which the thermoelectric junctions are subjected, N the number of thermoelectric junctions of the thermoelectric device, Sp the Seebeck coefficient of the P-type material used for example to form each second pad 102, and Sn the Seebeck of the N-type material used to form each first pad 101;
- a useful electric power $P_u$ which could be determined in the following manner (denoted equation (3) later on):

$$P_u = \frac{V_{oc}^2}{4 \times R_{int}}$$

The equation (1) neglects the electrical contact resistances and the electrical resistances of the connecting elements 107 and of the linking elements 106 which generally have negligible contributions in comparison with the electrical resistances of the N and P pads.

Hence, to obtain a high useful power, there should be a high output voltage and a low electrical resistance simultaneously.

When attempting to achieve that, there are two main methods using thin film technologies allowing making microelectronic thermoelectric devices with thin films compatible with microelectronics processes.

The first method is of the «2D» («two-dimensional») technology type, in other words a planar technology type. In this method, the first pads 101 and the second pads 102 mentioned hereinbefore in connection with FIG. 1 are in the form of rows, respectively N and P doped, connected electrically in series and thermally in parallel. In general, this technology is carried out only by microelectronics thin film forming techniques, that is to say for thickness values comprised between 1 nm and 100 µm.

This method type is well suited for the manufacture of thermoelectric devices such as microsensors, but it is not suited for the manufacture of thermoelectric devices intended to generate electricity according to Seebeck effect.

Indeed, the two thermal sides, positioned in the plane of the thermoelectric device obtained in 2D, are away from each other by a distance corresponding to the length of the rows forming the first and second pads. Thus, to obtain a high ΔT of the equation 3 (the effective temperature difference between the first thermal side and the second thermal side to which the thermoelectric junctions are subjected), the thermal sides should be as away as possible from each other and thermally-insulated from each other. This involves the formation of rows forming the longest possible first and second pads. But in this case, the electrical resistance according to the equation 1 increases, which burdens the useful power according to the equation 3, which is not satisfactory.

In addition, from a manufacturing perspective, this requires the sequential completion of several deposition (thermoelectric materials, insulating materials, electrically-conductive materials . . . ), lithography, etching, annealing steps. All these operations are long, tedious and delicate to implement, besides being expensive.

The second method is of the «3D» («three-dimensional») technology type, in other words orthogonal technology type. This method could be obtained using one single bulk substrate, or by stacking of substrates where each one is obtained by the previously-described 2D technology. The architecture of the obtained thermoelectric device allows exploiting, in the context of electrical energy generation, a hot source (placed on the hot side) and a cold source (placed on the cold side) arranged opposite, in particular orthogonally, to the plane of the substrate(s). A cold source has a temperature strictly lower than the temperature that the hot source has. In other words, the hot and cold sources could extend on either side of a wall constituted by a plate formed by the substrate(s).

Thus, even though such an architecture has the advantage of offering a low electrical resistance thanks to the height H of each of the first and second pads generally amounts to a few micrometers, that is to say comprised between 1 and 100 microns, in the microelectronics field, it has the drawback of being difficult to obtain a satisfactory temperature difference to generate a high output voltage since the latter depends on the temperature difference, which temperature difference depending on the temperature of the hot source and on the temperature of the cold source. However, the closer are the hot source and the cold source in the case of a very thin wall, the more obtaining a high temperature difference to be exploited in the context of Seebeck effect will be difficult to obtain.

In addition, from a manufacturing perspective, in the case where the wall consists of a stack of substrates each obtained by a 2D technology, this requires the sequential completion of several deposition (thermoelectric materials, insulating materials, electrically-conductive materials . . . ), lithography, etching, annealing steps. All these operations are long, tedious and delicate to implement, besides being expensive.

Still from a manufacturing perspective but in the case where the wall consists of a bulk substrate, herein again, it is unfortunately necessary to sequentially complete a lot of sintering, polishing, cutting, metallization, annealing transfer, also called «pick and place» according to the dedicated terminology, steps, etc . . . . This consists of a complex manufacture which, furthermore, limits a lot the geometry and the modularity of the manufactured thermoelectric device.

In this respect, it should be understood that there is a need for providing a manufacturing method allowing obtaining a thermoelectric device, suited in particular to constitute an energy generator for electrical energy production by exploiting a temperature difference to which the thermoelectric device is subjected, which has a very good efficiency, a low electrical resistance and which could be used with a large temperature difference between the hot and cold sources, where in addition, this method advantageously comprises less steps than is the case in the mentioned state of the art, is more simple and more economical, allows for a great shape and design modularity of the manufactured thermoelectric device, reduces the material losses, facilitates integration and interfacing, allows implementing complex assemblies, is quick to implement.

These needs also arise for the manufacture of a thermoelectric device adapted to operate in Peltier mode, that is to say one that could be supplied with electrical energy so as to cool down one of its sides amongst the first thermal side or the second thermal side.

OBJECT OF THE INVENTION

The present invention aims at providing a method for manufacturing a thermoelectric device addressing the above-mentioned problems.

This object could be achieved thanks to the implementation of a method for manufacturing a thermoelectric device, which thermoelectric device comprises a plurality of thermoelectric junctions where each thermoelectric junction, on the one hand, is arranged between a first thermal side and a second thermal side of the thermoelectric device and, on the other hand, comprises a first element doped according to a first doping type extending between said first and second thermal sides and a second element doped according to a second doping type and extending between said first and second thermal sides, the first element and the second element being electrically connected together at one of said first and second thermal sides and allowing generating a thermoelectric effect, the manufacturing method comprising:

a step a) of manufacturing at least one first part formed in a first material doped according to the first doping type and shaped like a comb delimiting a first base and a plurality of first branches substantially parallel to one another and extending substantially orthogonally from the first base, a step b) of manufacturing at least one second part formed in a second material doped according to the second doping type shaped like a comb delimiting a second base and a plurality of second branches substantially parallel to one another and extending substantially orthogonally from the second base, an assembly step c) during which the first part and the second part are mechanically assembled together to form a self-supporting set, an electrical connection step d) in which the distal end of all or part of the first branches of the first part are electrically connected to the second base of the second part and in which the distal end of all or part of the second branches of the second part are electrically connected to the first base of the first part, a cutting step e) in which the first base is sectioned into at least one first area located between the root of one of the first branches and the contact with one of the adjacent second branches and in which the second base is sectioned into at least one second area located between the root of one of the second branches and the contact with one of the first branches, on completion of which step e) each first branch and each second branch separated by a first area respectively constitute the first element and the second element of a thermoelectric junction electrically connected via the portion of the second base linking said first branch and said second branch separated in this manner by this first area, whereas each first branch and each second branch separated by a second area respectively constitute the first element and the second element of a thermoelectric junction electrically connected via the portion of the first base linking said first branch and said second branch separated in this manner by this second area.

Some preferred, yet non-limiting, aspects of this manufacturing method are the following ones, these could be implemented separately or in combination.

After step e), the manufacturing method comprises an electrical connection step f) in which the thermoelectric junctions created at step e) are electrically connected together so as to connect them in series and/or in parallel.

During step e), the arrangement of a first area and of a second area on either side of one of the first branches, or of one of the second branches, creates a thermoelectric junction in series with any other thermoelectric junction also created at step e).

Steps c) and d) are obtained in one single operation, in which the distal end of at least one of the first branches is electrically and mechanically connected with the second base and in which the distal end of at least one of the second branches is electrically and mechanically connected with the first base.

Step a) consists of an additive manufacturing method in which a material is deposited through successive passes on a tray, the result of the successive depositions during the different passes comprising a first comb whose shape corresponds to the shape of each first part.

A plurality of first combs secured together so as to form a first block in one-piece are obtained during step a) and step a) comprises a fractionation step a1) in which said first block is fractionated in order to deliver said plurality of first combs shaped in unitary manner and separated from one another.

The material used in the additive manufacturing method in step a) is the first material in which each first part is made.

Step b) consists of an additive manufacturing method in which a material is deposited through successive passes on a tray, the result of the successive depositions during the different passes comprising a second comb whose shape corresponds to the shape of each second part.

A plurality of second combs secured together so as to form a second block in one-piece are obtained during step b) and step b) comprises a fractionation step b1) in which said second block is fractionated in order to deliver said plurality of second combs shaped in unitary manner and separated from one another.

The material used in the additive manufacturing method in step b) is the second material in which each second part is made.

The material used in the additive manufacturing method of step a) and the material used in the additive manufacturing method of step b) are identical, and step a) comprises a step of doping by implantation or by heat treatment in order to transform the material used in the additive manufacturing method of step a) into the first material in which the at least one first part is made, whereas step b) comprises a step of doping by implantation or by heat treatment in order to transform the material used in the additive manufacturing method of step b) into the second material in which the at least one second part is made.

BRIEF DESCRIPTION OF THE DRAWINGS

Other aspects, objects, advantages and features of the invention will appear better upon reading the following detailed description of preferred embodiments thereof, provided as a non-limiting example, and made with reference to the appended drawings wherein.

DETAILED DESCRIPTION

Figure 1:
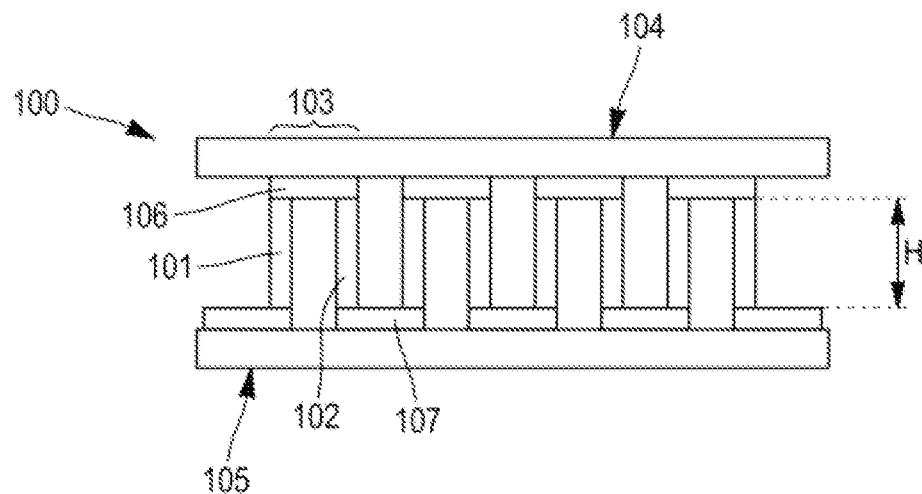
FIG. 1 represents, according to a sectional view, a thermoelectric device according to the prior art.

In FIGS. 1 to 8 and in the following description, the same references represent identical or similar elements. In addition, the different elements are not represented to scale in order to promote clarity of the figures. Moreover, the different embodiments and variants do not exclude each other and could be combined together.

As mentioned in the state of the art part, the thermoelectric device manufactured by implementation of the manufacturing method that will be described hereinafter could operate in Seebeck mode: the thermoelectric device is then an electrical energy generator, or in Peltier mode: the thermoelectric device is then a thermal energy generator. These operating modes are well known to those skilled in the art, and will not be described in more details.

In the present description, by «based on», it should be understood «includes primarily» or is «constituted by».

In the present description, for a dimension comprised between two values, the bounds formed by these two values are included.

By «substantially orthogonal», it should be understood in the present description «orthogonal» or «orthogonal within a tolerance of substantially 10°».

By «substantially parallel», it should be understood in the present description «parallel» or «parallel within a tolerance of substantially 10°».

The method consists in manufacturing a thermoelectric device 1, which thermoelectric device 1 comprises a plurality of thermoelectric junctions 2.

Each thermoelectric junction 2 is arranged between a first thermal side 3 and a second thermal side 4 of the thermoelectric device 1. Each thermoelectric junction 2 comprises a first element 5 doped according to a first doping type extending between the first thermal side 3 and the second thermal side 4. Each thermoelectric junction 2 also comprises a second element 6 doped according to a second doping type and extending between the first thermal side 3 and the second thermal side 4. The first element 5 and the second element 6 are electrically connected together at one of the first and second thermal sides 3, 4 and allow generating a thermoelectric effect.

A temperature difference between the first and second thermal sides 3, 4 could be generated, or exploited, by the thermoelectric device 1 (and therefore by the at least one thermoelectric junction 2) depending on its operating mode. In particular, the first thermal side 3 is a «hot side» and the second thermal side 4 is a «cold side», the opposite is of course possible. The temperature difference could be observed between the first thermal side 3 and the second thermal side 4, the temperature gradient at the terminals of the, or of each of the, thermoelectric junctions 2 depends on this temperature difference.

Each thermoelectric junction 2 of the thermoelectric device 1 is configured to generate a thermoelectric effect, in particular during the operation of the thermoelectric device 1. In Seebeck mode, the thermoelectric effect is such that the at least one thermoelectric junction 2 enables the generation of an electrical energy when it is subjected to a temperature difference applied to the thermoelectric device 1, in particular between its first and second thermal sides 3, 4. In Peltier mode, the thermoelectric effect is such that the at least one thermoelectric junction 2 enables the generation of a thermal energy (temperature difference between the first and second thermal sides 3, 4) when it is subjected to an electrical energy electrically powering the at least one thermoelectric junction 2.

Figure 2:
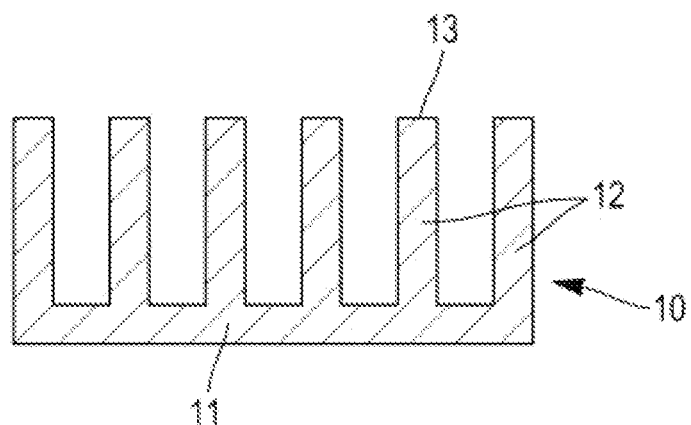
FIG. 2 schematically represents an example of a first part that could be used in an example of a manufacturing method according to the invention, at step a), the second part having a shape identical to the shape of the first part.

Thus, the manufacturing method comprises at first a step a) of manufacturing at least one first part 10 formed in a first material doped according to the aforementioned first doping type. Referring to FIG. 2, for example, each first part 10 manufactured at step a) is shaped like a comb delimiting a first base 11 and a plurality of first branches 12 substantially parallel to one another and extending substantially orthogonally from the first base 11.

Preferably, the first material mentioned hereinbefore is selected amongst $Bi_2Te_3$, Si, SiGe, MnSi, the materials from the skutterudites family (a mineral species composed by cobalt and nickel arsenide of formula $As_{3-x}$ with traces of S, Bi, Cu, Pb, Zn, Ag, Fe and Ni), Half-Heusler, etc.

In a particularly advantageous manner for the present method and in order to address the problems mentioned in connection with the prior art, in a particular embodiment, step a) consists of an additive manufacturing method, also called 3D printing, in which a material is deposited through successive passes on a tray, the result of the successive depositions during the different passes comprising at least one first comb as mentioned hereinabove in the previous paragraph, that is to say whose shape corresponds to the shape of each first part 10. The number of passes is related to the thickness, the selection of the materials may be done in a non-exclusive manner from the list provided in the previous paragraph.

The additive manufacturing method of step a) may for example correspond to the technologies known as «SLM» which is the acronym of «Selective Laser Melting» according the dedicated terminology or as «SLS» which is the acronym of «Selective Laser Sintering» according the dedicated terminology. Other additive manufacturing techniques may be considered, such as «Binder Jetting», «Electron Beam Melting», etc. Each has its specificity and either technique could be selected depending on the nature of the material to be manufactured, these arrangements being known and conventional.

In a first variant, the additive manufacturing method of step a) is parameterized and carried out so that each comb obtained by this method directly has the shape of the first comb according to which the first part 10 is shaped. In other words, each of the first parts 10 is directly manufactured by the additive manufacturing method separately from the others.

In a second variant, the shape of the comb manufactured by the additive manufacturing method of step a) corresponds to a plurality of first combs secured together so as to form a first block in one-piece. In this case, step a) comprises a fractionation step a1) in which this first block is fractionated in order to deliver the plurality of uniquely-shaped first combs separated from one another. For example, the fractionation implemented at step a1) could be performed by mechanical machining, by water jet, or any other equivalent technique suited to the nature and the thickness of the material to be fractionated.

Figure 3:
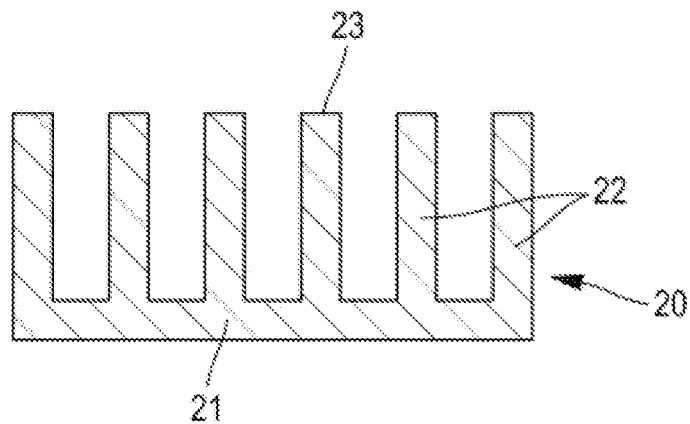
FIG. 3 schematically represents an example of a first part that could be used in an example of a manufacturing method according to the invention, at step b).

In addition, the manufacturing method comprises a step b) of manufacturing at least one second part 20 formed in a second material doped according to the aforementioned second doping type. Referring to FIG. 3, for example, each second part 20 manufactured at step b) is shaped like a comb delimiting a second base 21 and a plurality of second branches 22 substantially parallel to one another and extending substantially orthogonally from the second base 21.

Preferably, the second material mentioned hereinbefore is selected amongst $Bi_2Te_3$, Si, SiGe, MnSi, the materials from the skutterudites family, Half-Heusler, etc.

In a particularly advantageous manner for the present method and in order to address the problems mentioned in connection with the prior art, in a particular embodiment, step b) also consists of an additive manufacturing method, also called 3D printing, in which a material is deposited through successive passes on a tray, the result of the successive depositions during the different passes comprising at least one second comb as mentioned hereinabove in the previous paragraph, that is to say whose shape corresponds to the shape of each second part 20. The number of passes is related to the thickness, the selection of the materials may be done in a non-exclusive manner from the list provided in the previous paragraph.

The additive manufacturing method of step b) may for example correspond to the technologies known as «SLM» which is the acronym of «Selective Laser Melting» according the dedicated terminology or as «SLS» which is the acronym of «Selective Laser Sintering» according the dedicated terminology. Other additive manufacturing techniques may be considered, such as «Binder Jetting», «Electron Beam Melting», etc. Each has its specificity and either technique could be selected depending on the nature of the material to be manufactured, these arrangements being known and conventional.

In a first variant, the additive manufacturing method of step b) is parameterized and carried out so that each comb obtained by this method directly has the shape of the second comb according to which the second part 20 is shaped. In other words, each of the second parts 20 is directly manufactured by the additive manufacturing method separately from the others.

In a second variant, the shape of the comb manufactured by the additive manufacturing method of step b) corresponds to a plurality of second combs secured together so as to form a second block in one-piece. In this case, step b) comprises a fractionation step b1) in which this second block is fractionated in order to deliver the plurality of uniquely-shaped second combs separated from one another. For example, the fractionation implemented at step b1) could be performed by mechanical machining, by water jet, or any other equivalent technique suited to the nature and the thickness of the material to be fractionated.

In a first variant, the material used in the additive manufacturing method in step a) is the first material in which each first part 10 is made. The material used in the additive manufacturing method in step b) could also be the second material in which each second part 20 is made.

Alternatively, in a second variant, the material used in the additive manufacturing method of step a) and the material used in the additive manufacturing method of step b) are identical. Examples of materials that could be used in this variant include Si or SiGe. In this case, step a) comprises a step of doping by implantation or by heat treatment, these techniques being conventional and known to those skilled in the art, in order to transform the material used in the additive manufacturing method of step a) into the first material in which the at least one first part 10 is made and step b) comprises a step of doping by implantation or by heat treatment, these techniques being conventional and known to those skilled in the art, in order to transform the material used in the additive manufacturing method of step b) into the second material in which the at least one second part 20 is made.

In particular, each of the first part 10 and the second part 20 is formed by, or includes, a thermoelectric material. The result is that the first branches 12 and the first base 11 are formed by a thermoelectric material and the second branches 22 and the second base 12 are formed by a thermoelectric material. The first thermoelectric material of the first part 10 has thermoelectric properties different from those of the second thermoelectric material of the second part to ensure the pursued Peltier, or Seebeck, effect. Preferably, the first thermoelectric material is of the N-type, and the second thermoelectric material is of the P-type. The N-type first thermoelectric material allows promoting the displacement of electrons. The P-type second thermoelectric material allows promoting the displacement of electron holes. According to another formulation, the N-type first thermoelectric material has a strictly negative Seebeck coefficient, and the P-type second thermoelectric material has a strictly positive Seebeck coefficient. Preferably, to promote the displacement of the electrons, the first thermoelectric material of the first part 10 is, or is based on, a N-type doped material, such as for example a silicon-germanium alloy (SiGe) doped by phosphorous or a N-type doped polysilicon. In general, the N-type dopant may be phosphorous or arsenic. Preferably, to promote the displacement of the electron holes, the second thermoelectric material of the second part 20 is, or is based on, a P-type doped material, such as for example a silicon-germanium alloy (SiGe) doped with boron or a P-type doped polysilicon. In general, the P-type dopant is preferably boron. By doping, it should be understood electrical doping.

After steps a) and b) as described hereinbefore, the manufacturing method comprises an assembly step c) during which the first part 10 and the second part 20 are mechanically assembled together to form a self-supporting set. To achieve this assembly, it is possible to secure the distal ends 13 of at least two, preferably all, of the first branches 12 of the first part 10 to the second base 21 of the second part 20 and/or secure the distal ends 23 of at least two, preferably all, of the second branches 22 of the second part 20 to the first base 11 of the first part 10.

The manufacturing method also comprises an electrical connection step d) in which the distal end 13 of all or part of the first branches 12 of the first part 10 are electrically connected to the second base 21 of the second part 20 and the distal end 23 of all or part of the second branches 22 of the second part 20 are electrically connected to the first base 11 of the first part 10.

Figure 4:
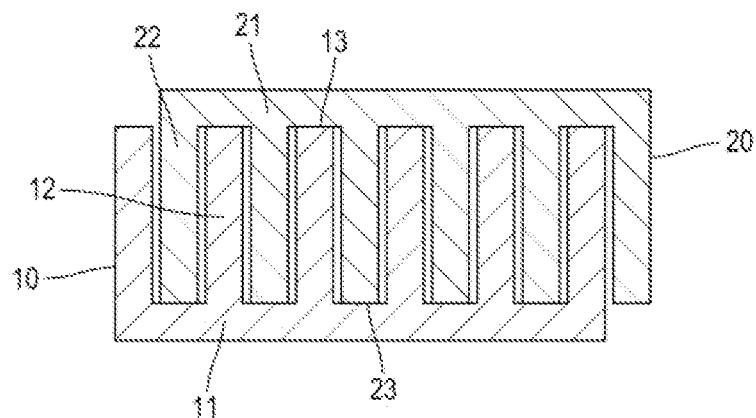
FIG. 4 represents the assembly of the first part and of the second part upon completion of step c) and/or step d).

In a first variant as illustrated in FIG. 4, step c) and d) are obtained in one single operation, in which the distal end of at least one of the first branches 12 is electrically and mechanically connected with the second base 21 and the distal end 23 of at least one of the second branches 22 is electrically and mechanically connected with the first base 11. As example, this operation could be obtained by a laser welding technique for example. An advantage of this variant is that it is effective, economical and limits the number of steps of the manufacturing method.

The parameters of the laser welding depend on the nature of the considered thermoelectric materials.

Nonetheless, it is still possible in an alternative second variant to carry out step c) and step d) successively. For example, it is possible to carry out step c) by a bonding technique and then carry out step d) by carrying out a deposition suited to an electrically-conductive material in the connecting area of the distal ends 13 of the first branches 12 with the second base 21 and in the connecting area of the distal ends 23 of the second branches 22 with the first branch 11. For the implementation of such a step d), the electrical connection between the first branches 12 and the second base 21 and between the second branches 22 and the first base 11 may, for example, be formed by an electrical linking element made of a metallic material, or of a metallic alloy, selected for example amongst aluminum, copper with a SnAg alloy, nickel with gold, and titanium.

Figure 5:
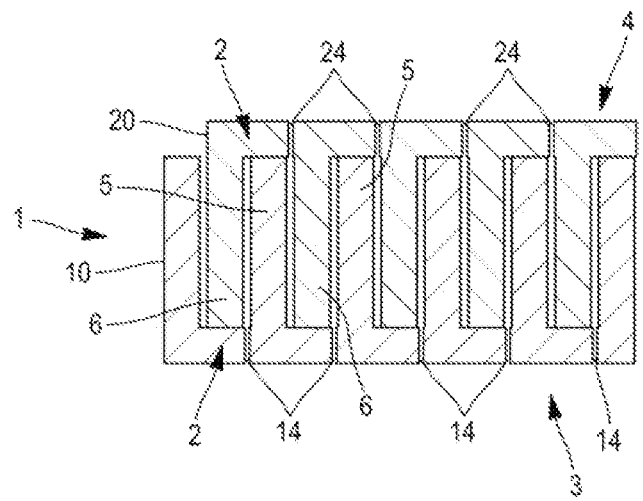
FIG. 5 represents an example of a situation after step e).
Figure 6:
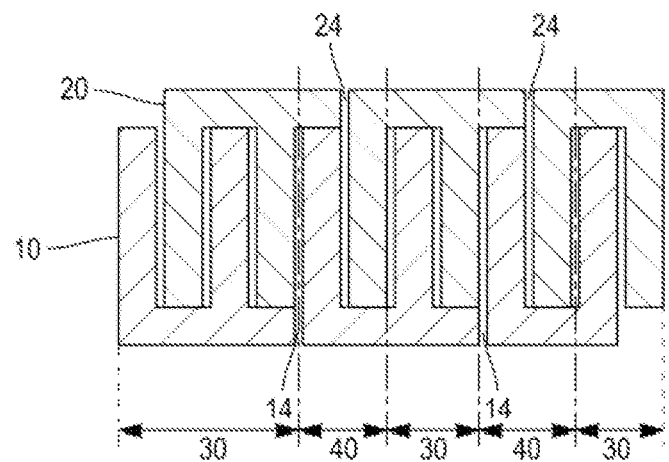
FIG. 6 represents another example of a situation after step e).

Moreover, once step d) is completed, the manufacturing method comprises, with reference to FIG. 5 and FIG. 6 which illustrate two possible variants, a cutting step e) in which the first base 11 is sectioned into at least one first area 14 located between the root (that is to say the connecting area between the first base 11 and the corresponding first branch 12) of one of the first branches 12 and the contact with one of the adjacent second branches 22 and in which the second base 21 is sectioned into at least one second area 24 located between the root (that is to say the connecting area between the second base 21 and the corresponding second branch 22) of one of the second branches 22 and the contact with one of the first branches 11.

Upon completion of step e), each first branch 12 and each second branch 22 separated by a first area 14 respectively constitute the first element 5 and the second element 6 of a thermoelectric junction 2 electrically connected together via the portion of the second base 21 linking this first branch 12 and this second branch 22 separated in this manner by this first area 14. Moreover, still on completion of step e), each first branch 12 and each second branch 22 separated by a second area 24 respectively constitute the first element 5 and the second element 6 of a thermoelectric junction 2 electrically connected via the portion of the first base 11 linking this first branch 12 and this second branch 22 separated in this manner by this second area 24.

For example, the cut implemented at step e) could be performed by mechanical machining, by water jet, or any other equivalent technique suited to the nature and the thickness of the material to be cut.

In general, during step e), the arrangement of a first area 14 and of a second area 24 on either side of a given one amongst the first branches 23, or of a given one amongst the second branches 22, creates a thermoelectric junction 2 in series with any other thermoelectric junction also created at step e).

In FIG. 5, there is illustrated the case where all pairs of branches comprising a first branch 12 and an adjacent second branch 22 are separated from the other pairs by a first area 14 formed in the first base 21 and where all pairs of branches comprising a first branch 12 and an adjacent second branch 22 are separated from the other pairs by a second area 24 formed in the second base 21. Such an organization allows all thermoelectric junctions to be electrically connected together in series and to be thermally connected together in parallel.

FIG. 6 represents an alternative implementation where only some first areas 14 are formed in the first base 11 and only some second areas 24 are formed in the second base 21, in order to keep some thermoelectric junctions 2 electrically connected together in parallel. For example, in FIG. 5, the thermoelectric junctions located in the locations 30 are connected together in parallel whereas the thermoelectric junctions located in the locations 40 are connected together in series.

This is intended to demonstrate the fact that it is possible to combine series connections and parallel connections to optimize the output electrical performances of the manufactured thermoelectric device 1. Indeed, this offers the possibility of electrically connecting the different thermoelectric junctions in a customized manner. Usually, as is the case in FIG. 5, all thermoelectric junctions are electrically connected in series. But this could result in obtaining high output voltages (several volts and even tens of volts), which might be incompatible with some associated electronics for which the required voltages generally amount to a few volts. The possibility of connecting some thermoelectric junctions in parallel allows reducing this output voltage of the thermoelectric device 1 while maintaining the generated power.

In addition, after step e), the manufacturing method comprises an electrical connection step f) in which the thermoelectric junctions 2 created at step e) are electrically connected together so as to connected them in series and/or in parallel. According to a first implementation, the electrical connection is performed naturally when the junctions are mechanically connected together, for example by welding. Alternatively, in a second implementation, the electrical connection of the junctions is accompanied with an electrical connection step, for example through a deposition of an electrically-conductive metal properly arranged.

Figure 7:
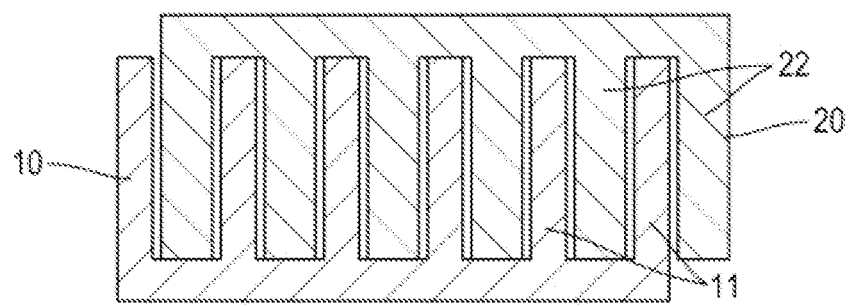
FIG. 7 represents a variant to FIG. 4 where the second part has a shape different from the shape of the first part with regards to the width of the branches.

While in the previous figures, the shape of the first part 10 is identical to that of the second part 20, FIG. 7 is intended to illustrate the fact that the second part 20 could possibly have a shape different from the shape of the first part 10 with regards to the width of the branches. This allows affecting the equations 1 and 3. As example as shown in FIG. 7, the width of the second branches 22 could be larger than the width of the first branches 11.

Figure 8:
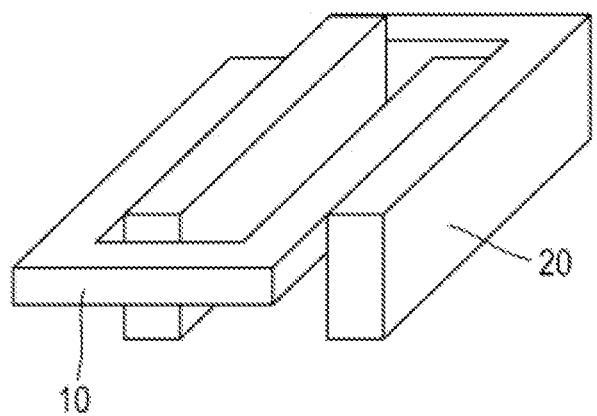
FIG. 8 represents, in perspective, a variant to FIG. 4 where the second part has a thickness larger than the thickness of the first part.

In combination with or alternatively to what has just been described in connection with FIG. 7, while in FIGS. 2 to 6 the shape of the first part 10 is identical to that of the second part 20, FIG. 10 is intended to illustrate the fact that the second part 20 could possibly have a shape different from the shape of the first part 10 with regards to the thickness of the parts 10, 20. This also allows affecting the equations 1 and 3. As example as shown in FIG. 8, the thickness of the second part 20 is larger than the thickness of the first part 10.

The manufacturing method that has just been described has the following advantages:
- it allows obtaining a thermoelectric device, in particular suited to constitute an energy generator for the production of electrical energy by exploiting a temperature difference to which the thermoelectric device is subjected, which has a very good efficiency, a low electrical resistance and which could be used with a large temperature difference between the hot and cold sources,
- it advantageously comprises a small number of steps,
- it is simple and economical,
- it allows for a great modularity of shape and design of the manufactured thermoelectric device,
- it reduces material losses,
- it facilitates integration and interfacing,
- it allows implementing complex assemblies,
- it is quick to execute.

The invention claimed is:

1. A method for manufacturing a thermoelectric device, which thermoelectric device comprises a plurality of thermoelectric junctions where each thermoelectric junction, on the one hand, is arranged between a first thermal side and a second thermal side of the thermoelectric device and, on the other hand, comprises a first element doped according to a first doping type extending between said first and second thermal sides and a second element doped according to a second doping type and extending between said first and second thermal sides, the first element and the second element being electrically connected together at one of said first and second thermal sides and allowing generating a thermoelectric effect, the manufacturing method comprising:
   a step a) of manufacturing at least one first part formed in a first material doped according to the first doping type and shaped like a comb delimiting a first base and a plurality of first branches substantially parallel to one another and extending substantially orthogonally from the first base,
   a step b) of manufacturing at least one second part formed in a second material doped according to the second doping type shaped like a comb delimiting a second base and a plurality of second branches substantially parallel to one another and extending substantially orthogonally from the second base,
   an assembly step c) during which the first part and the second part are mechanically assembled together to form a self-supporting set,
   an electrical connection step d) in which a distal end of all or part of the first branches of the first part are electrically connected to the second base of the second part and in which a distal end of all or part of the second branches of the second part are electrically connected to the first base of the first part,
   a cutting step e) in which the first base is sectioned into at least one first area located between a root of one of the first branches and contact with one of the adjacent second branches and in which the second base is sectioned into at least one second area located between a root of one of the second branches and contact with one of the first branches,
   on completion of which the step e) each first branch and each second branch separated by a first area respectively constitute the first element and the second element of a thermoelectric junction electrically connected via a portion of the second base linking said first branch and said second branch separated in this manner by the first area,
   whereas each first branch and each second branch separated by a second area respectively constitute the first element and the second element of a thermoelectric junction electrically connected via a portion of the first base linking said first branch and said second branch separated in this manner by the second area.

2. The manufacturing method according to claim 1, wherein after the step e), the manufacturing method comprises an electrical connection step f) in which the thermoelectric junctions created at step e) are electrically connected together so as to connect them in series and/or in parallel.

3. The manufacturing method according to claim 1, wherein during the step e), an arrangement of the first area and of the second area on either side of one of the first branches, or of one of the second branches, creates the thermoelectric junction in series with any other thermoelectric junction also created at the step e).

4. The manufacturing method according to claim 1, wherein the steps c) and d) are obtained in one single operation, in which the distal end of at least one of the first branches is electrically and mechanically connected with the second base and in which the distal end of at least one of the second branches is electrically and mechanically connected with the first base.

5. The manufacturing method according to claim 1, wherein the step a) consists of an additive manufacturing method in which a material is deposited through successive passes on a tray, the result of the successive depositions during the different passes comprising a first comb whose shape corresponds to the shape of each first part.

6. The manufacturing method according to claim 5,
wherein a plurality of the first combs secured together so as to form a first block in one-piece are obtained during the step a), and
wherein the step a) comprises a fractionation step a1) in which said first block is fractionated in order to deliver said plurality of the first combs shaped in unitary manner and separated from one another.

7. The manufacturing method according to claim 5, wherein the material used in the additive manufacturing method in the step a) is the first material in which the first part is made.

8. The manufacturing method according to claim 1, wherein the step b) consists of an additive manufacturing method in which a material is deposited through successive passes on a tray, the result of the successive depositions during the different passes comprising a second comb whose shape corresponds to the shape of each second part.

9. The manufacturing method according to claim 8,
wherein a plurality of the second combs secured together so as to form a second block in one-piece are obtained during the step b), and
wherein the step b) comprises a fractionation step b1) in which said second block is fractionated in order to deliver said plurality of the second combs shaped in unitary manner and separated from one another.

10. The manufacturing method according to claim 8, wherein the material used in the additive manufacturing method in the step b) is the second material in which the second part is made.

11. The manufacturing method according to claim 5,
wherein the step b) consists of an additive manufacturing method in which a material is deposited through successive passes on a tray, the result of the successive depositions during the different passes comprising a second comb whose shape corresponds to the shape of each second part,
wherein the material used in the additive manufacturing method of the step a) and the material used in the additive manufacturing method of the step b) are identical,
wherein the step a) comprises a step of doping by implantation or by heat treatment in order to transform the material used in the additive manufacturing method of the step a) into the first material in which the at least one first part is made, and
wherein the step b) comprises a step of doping by implantation or by heat treatment in order to transform the material used in the additive manufacturing method of the step b) into the second material in which the at least one second part is made.

* * * * *